(12) United States Patent
Arita

(10) Patent No.: US 6,897,128 B2
(45) Date of Patent: May 24, 2005

(54) METHOD OF MANUFACTURING SEMICONDUCTOR DEVICE, PLASMA PROCESSING APPARATUS AND PLASMA PROCESSING METHOD

(75) Inventor: Kiyoshi Arita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/716,965

(22) Filed: Nov. 19, 2003

(65) Prior Publication Data

US 2004/0102025 A1 May 27, 2004

(30) Foreign Application Priority Data

Nov. 20, 2002 (JP) .......................... 2002-336415
Nov. 20, 2002 (JP) .......................... 2002-336416

(51) Int. Cl.[7] .................... H01L 21/46; H01L 21/78; H01L 21/301
(52) U.S. Cl. .................... 438/460; 438/462; 438/464; 438/710; 438/977
(58) Field of Search .................... 438/460, 458–459, 438/462, 464, 710, 977, 33, 68, 113–114

(56) References Cited

U.S. PATENT DOCUMENTS

| 4,325,182 | A | 4/1982 | Tefft et al. |
| 5,275,958 | A | 1/1994 | Ishikawa |
| 5,693,182 | A | 12/1997 | Mathuni |
| 5,888,882 | A | 3/1999 | Igel et al. |
| 6,239,036 | B1 | 5/2001 | Arita et al. |
| 6,686,225 | B2 * | 2/2004 | Wachtler ............... 438/114 |
| 6,818,532 | B2 * | 11/2004 | Yeom et al. ........... 438/460 |
| 2002/0061642 | A1 | 5/2002 | Haji et al. |
| 2003/0129809 | A1 * | 7/2003 | Takyu et al. ........... 438/460 |

FOREIGN PATENT DOCUMENTS

JP          2002-93752          3/2002

* cited by examiner

Primary Examiner—Thanh Nguyen
(74) Attorney, Agent, or Firm—Pearne & Gordon LLP

(57) ABSTRACT

In a method of manufacturing a semiconductor device by dividing a semiconductor wafer 6, on which a plurality of semiconductor elements are formed, into individual pieces of the semiconductor elements, after thickness of a reverse face of a circuit formation face 6a is reduced by machining, a mask to determine cutting lines 31b is formed by a resist film 31a, and the semiconductor wafer 6 is divided into individual pieces of semiconductor elements 6c by conducting plasma etching on portions of the cutting lines 31b when plasma is exposed from the mask side, and then the resist film 31a is removed by plasma, and further a micro-crack layer 6b generated on the machined face is removed by plasma etching. A series of the above plasma processing is executed by the same plasma processing apparatus.

19 Claims, 11 Drawing Sheets

FIG. 11

| PROCESS | RF POWER (W) | PRESSURE (Pa) | DISTANCE BETWEEN ELECTRODE (mm) |
|---|---|---|---|
| PLASMA DICING | 500-3000 | 5-300 | 5-50 |
| ASHING | 100-1000 | 5-100 | 50-100 |
| PLASMA STRESS RELIEF | 500-3000 | 300-2000 | 5-20 |

METHOD OF MANUFACTURING SEMICONDUCTOR DEVICE, PLASMA PROCESSING APPARATUS AND PLASMA PROCESSING METHOD

BACKGROUND OF THE INVENTION

The present invention relates to a method of manufacturing a semiconductor device in such manner that a semiconductor wafer on which a plurality of semiconductor elements are formed is divided into individual pieces of the semiconductor elements, the thickness of the semiconductor device is not more than 100 μm. The present invention also relates to a plasma processing apparatus and a plasma processing method suitably used for the manufacturing method.

A semiconductor device mounted on a circuit board of electronic equipment is conventionally manufactured in such a manner that pins of a lead frame and metallic bumps are connected to semiconductor elements, on which a circuit pattern is formed in the state of a wafer, and the semiconductor elements are subjected to a packaging process so that they can be sealed with resin. Since the size of electronic equipment has been recently reduced, the size of the semiconductor device has been also decreased. Especially, they have been actively making investigation into the reduction of the thickness of a semiconductor element, and the semiconductor wafers, the thickness of which is not more than 100 μm, have been used.

The mechanical strength of the semiconductor element, the thickness of which is reduced, is so low that the semiconductor element is liable to break in the process of cutting in the dicing step in which the semiconductor element in the state of a wafer is cut into individual pieces, and the yield of machining is inevitably lowered. Concerning the method of cutting the semiconductor element, the thickness of which is reduced, instead of the mechanical cutting method, a plasma dicing method is proposed in which the semiconductor wafer is cut when cutting grooves are formed by the etching action of plasma. Concerning this method, for example, refer to Japanese Patent Publication 2002-93752.

This method is executed as follows. First, a face opposite to the circuit forming face is machined so as to reduce the thickness of a semiconductor wafer. When the thus machined face of the semiconductor wafer is subjected to plasma processing, stress relief is carried out in which a micro-crack layer generated on the machined face is removed. After that, a region on the semiconductor wafer except for the cutting lines is coated with resist, that is, a mask of a resist film is formed. Then, plasma processing is carried again from the mask forming face side. Due to the plasma processing, silicon in the portions of the cutting lines is removed by plasma etching, and the semiconductor wafer is divided into individual pieces of the semiconductor elements. After that, the mask is removed. In this way, the individual semiconductor device is completed.

However, in the process of cutting a semiconductor wafer of the prior art described above, the steps of stress relief, mask formation and plasma dicing are successively executed. Therefore, it is necessary to use an exclusive processing device for each step. That is, after plasma processing has been completed for stress relief, the semiconductor wafer must be picked up from the plasma processing apparatus. After the mask has been formed, the semiconductor wafer must be conveyed into the plasma processing apparatus again. Therefore, the following problems may be encountered. The manufacturing process becomes complicated, which increases the equipment cost of the production line and decreases the production efficiency. Further, when the very thin semiconductor wafer, the thickness of which is reduced by machining, is conveyed and handled between the processes, the semiconductor wafer is liable to be damaged, which inevitably decreases the manufacturing yield.

SUMMARY OF THE INVENTION

Therefore, it is an object of the present invention to provide a method of manufacturing a semiconductor device in that: the equipment cost is decreased and the production efficiency is increased by simplifying the manufacturing process; and the semiconductor wafer is prevented from being damaged when it is conveyed and handled, so that the manufacturing yield can be enhanced.

It is another object of the present invention to provide a plasma processing apparatus most appropriately used for the method of manufacturing a semiconductor device and to provide a plasma processing method.

In order to accomplish the first object, the present invention provides a method of manufacturing a semiconductor device in which a semiconductor wafer, on the first face of which a plurality of semiconductor elements are formed, is divided into individual pieces of semiconductor elements so as to obtain a semiconductor device, the thickness of which is not more than 100 μm, comprising: a sheet attaching step of attaching a protective sheet, capable of being peeled off, to the first face; a thickness reducing step of reducing the thickness of the semiconductor wafer to not more than 100 μm by shaving a second face, which is opposed to the first face, by means of machining; a mask forming step of forming a mask for determining cutting lines to divide the semiconductor wafer into the individual pieces on the second face; a plasma dicing step of dividing the semiconductor wafer to the individual pieces by carrying out plasma-etching on the cutting lines when the semiconductor wafer is exposed to plasma from the mask side; a mask removing step of removing the mask by utilizing plasma; a micro-crack removing step of removing micro-cracks, which are generated on the second face in the thickness reducing step, by carrying out plasma-etching on the second face from which the mask has been removed; and a sheet peeling step of peeling the protective sheet from each semiconductor device which has been obtained as an individual piece.

According to the present invention, a semiconductor wafer, on which a mask to determine cutting lines used for dividing a semiconductor wafer into individual pieces of semiconductor elements is formed, is subjected to each step as follows. The semiconductor wafer is subjected to a plasma dicing step of dividing the semiconductor wafer to individual pieces by carrying out plasma-etching on the cutting lines when the semiconductor wafer is exposed to plasma from the mask side; the semiconductor wafer is also subjected to a mask removing step of removing the mask by utilizing plasma; the semiconductor wafer is also subjected to a micro-crack removing step of removing micro-cracks, which are generated in the thickness reducing step. When these steps are continuously performed in the above order, the process of manufacturing the semiconductor device can be simplified, so that the equipment cost can be reduced and the production efficiency can be enhanced. Further, the semiconductor wafer can be prevented from being damaged when it is conveyed and handled, and the yield of machining can be enhanced.

In order to accomplish the second object, the present invention provides a plasma processing apparatus of executing the steps of plasma dicing, removing a mask and removing micro-cracks by carrying out plasma processing on a semiconductor wafer in which a protective sheet is attached on the first face on which semiconductor elements are formed and a mask for determining cutting lines to divide the semiconductor wafer into individual pieces of the semiconductor elements is formed on the second face opposite to the first face, the plasma processing apparatus comprising: a processing chamber; a first electrode having a plane with which the protective sheet tightly comes into contact in the processing chamber; a second electrode opposed to the first electrode in the processing chamber; a holding means for holding the semiconductor wafer by the first electrode under the condition that the protective sheet tightly comes into contact with the plane; a pressure reducing means for reducing pressure to a predetermined value in the processing chamber; a plasma generating gas supplying means for selectively supplying a plurality of types of plasma generating gases into the processing chamber; a pressure controlling means for controlling pressure in the processing chamber when plasma generating gas is supplied; a high frequency electric power supply section for supplying a high frequency voltage upon the first electrode so as to transfer the plasma generating gas, which has been supplied into the processing chamber, into a plasma state; and an electrode distance changing means for changing a distance between the first and the second electrode.

In order to accomplish the second object, the present invention provides a plasma processing method in which the steps of plasma dicing, removing a mask and removing micro-cracks are executed by carrying out plasma processing on a semiconductor wafer, on the first face having semiconductor elements of which a protective sheet is attached, on the second face on the opposite side to the first face of which a mask to determine cutting lines for dividing the semiconductor wafer into individual pieces of the semiconductor elements is formed, the plasma processing method comprising: a wafer holding step in which the semiconductor wafer is held by a first electrode under the condition that the protective sheet is tightly contacted with a plane of the first electrode in a processing chamber; a first condition setting step in which an electrode distance between a first electrode and a second electrode, which is arranged being opposed to the first electrode, and pressure in the processing chamber are set at a first condition; a plasma dicing step in which portions of the cutting lines are plasma-etched when a first plasma generating gas is supplied into the processing chamber and a high frequency voltage is supplied between the first electrode and the second electrode so that the first plasma generating gas is transferred into a plasma state; a second condition setting step in which the distance between the electrodes and the pressure in the processing chamber are set at a second condition; a mask removing step in which the mask is removed by ashing when a second plasma generating gas is supplied into the processing chamber and a high frequency voltage is supplied between the first electrode and the second electrode so that the second plasma generating gas is transferred into a plasma state; a third condition setting step in which the distance between the electrodes and the pressure in the processing chamber are set at a third condition; and a micro-crack removing step in which micro-cracks remaining on the second face, from which the mask has been removed, are removed by plasma etching when a third plasma generating gas is supplied into the processing chamber and a high frequency voltage is supplied between the first electrode and the second electrode so that the third plasma generating gas is transferred into a plasma state.

According to the present invention, the plasma processing apparatus includes: a pressure control means for controlling pressure in a processing chamber; a plasma generating gas supply section for selectively supplying a plurality of types of plasma generating gases into the processing chamber; and an electrode distance changing means for changing an electrode distance between the first electrode and the second electrode. A plasma dicing step of dividing a semiconductor wafer into individual pieces of semiconductor elements by plasma etching, a mask removing step of removing a mask by utilizing plasma and a micro-crack removing step of removing micro-cracks generated in the thickness reducing step can be continuously, effectively executed by the same plasma processing apparatus.

BRIEF DESCRIPTION OF DRAWINGS

FIG. 11 is a data table showing a plasma processing condition in the plasma processing of the embodiment of the present invention.

DETAILED DESCRIPTION OF THE PREFERRED EMBODIMENTS

Figure 1:
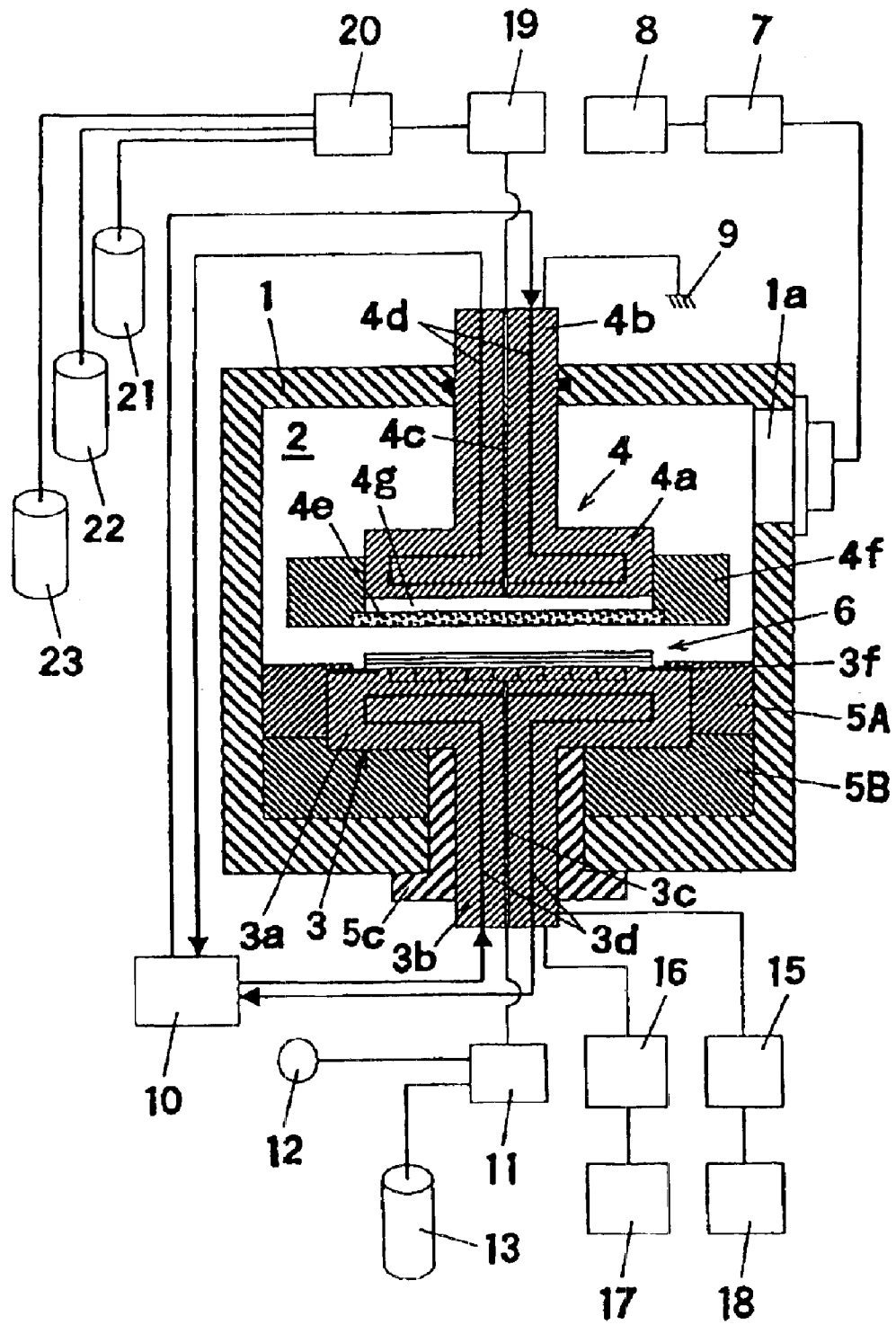
FIG. 1 is a cross sectional side view of a plasma processing apparatus of an embodiment of the present invention.
Figure 2:
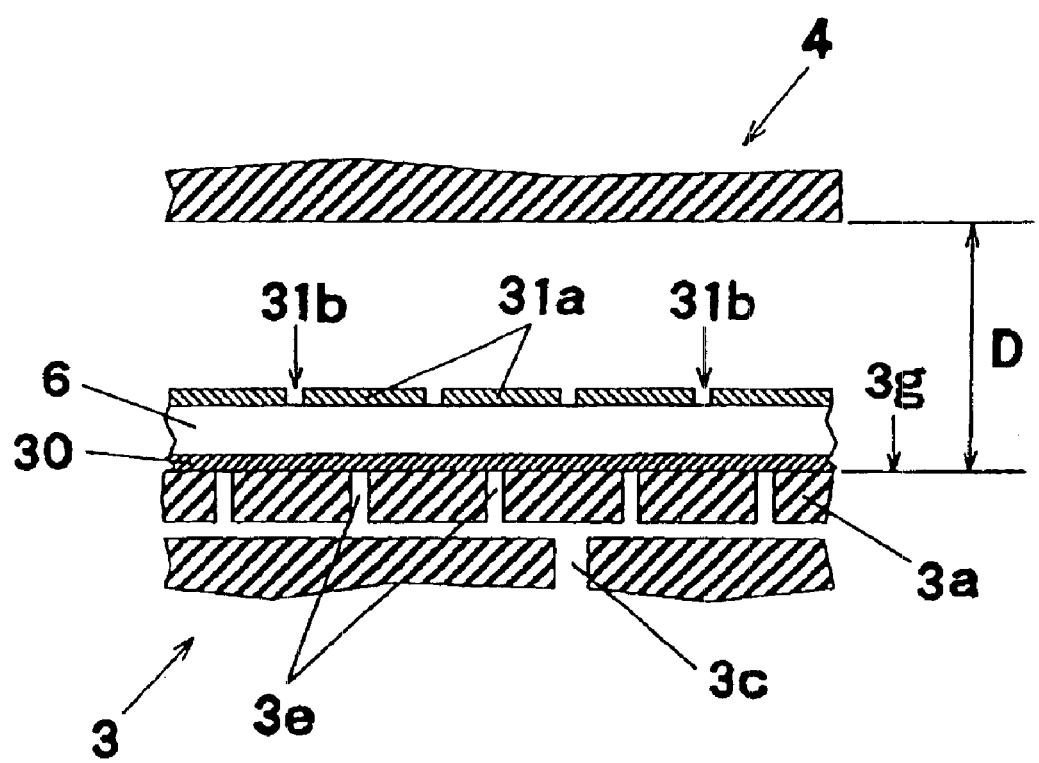
FIG. 2 is a partially cross sectional view of a lower electrode of the plasma processing apparatus of the embodiment of the present invention.
Figure 3:
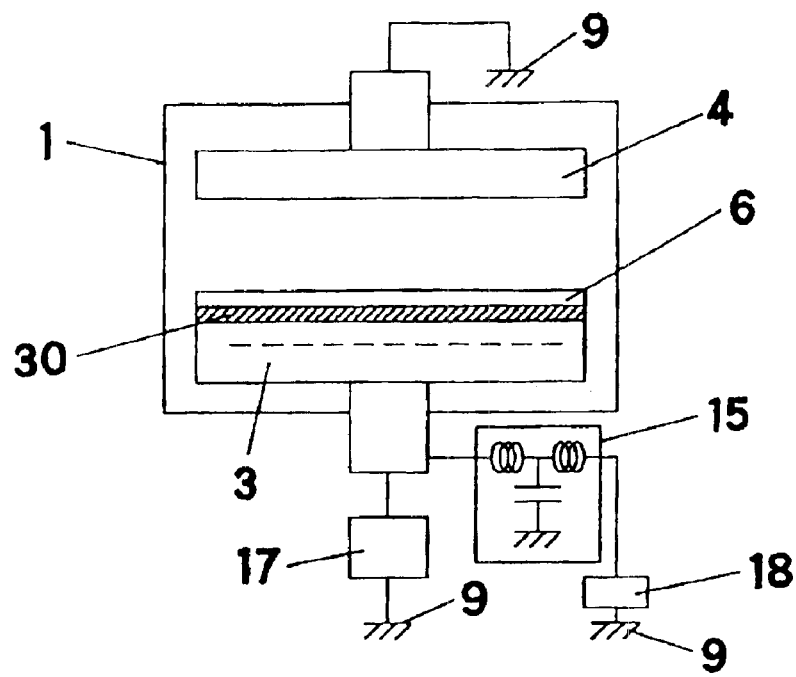
FIGS. 3(a) and 3(b) are cross sectional views of the plasma processing apparatus of the embodiment of the present invention.
Figure 3:
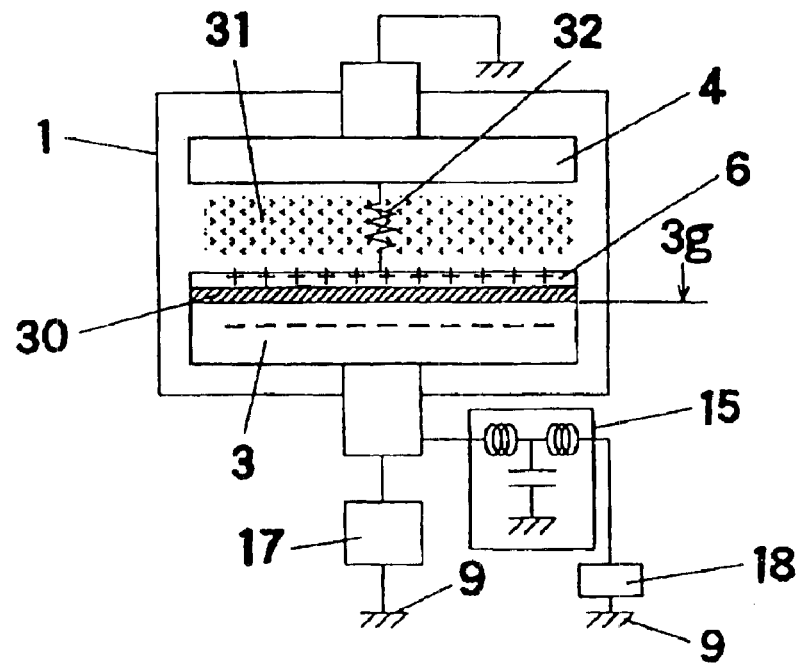
Figure 4:
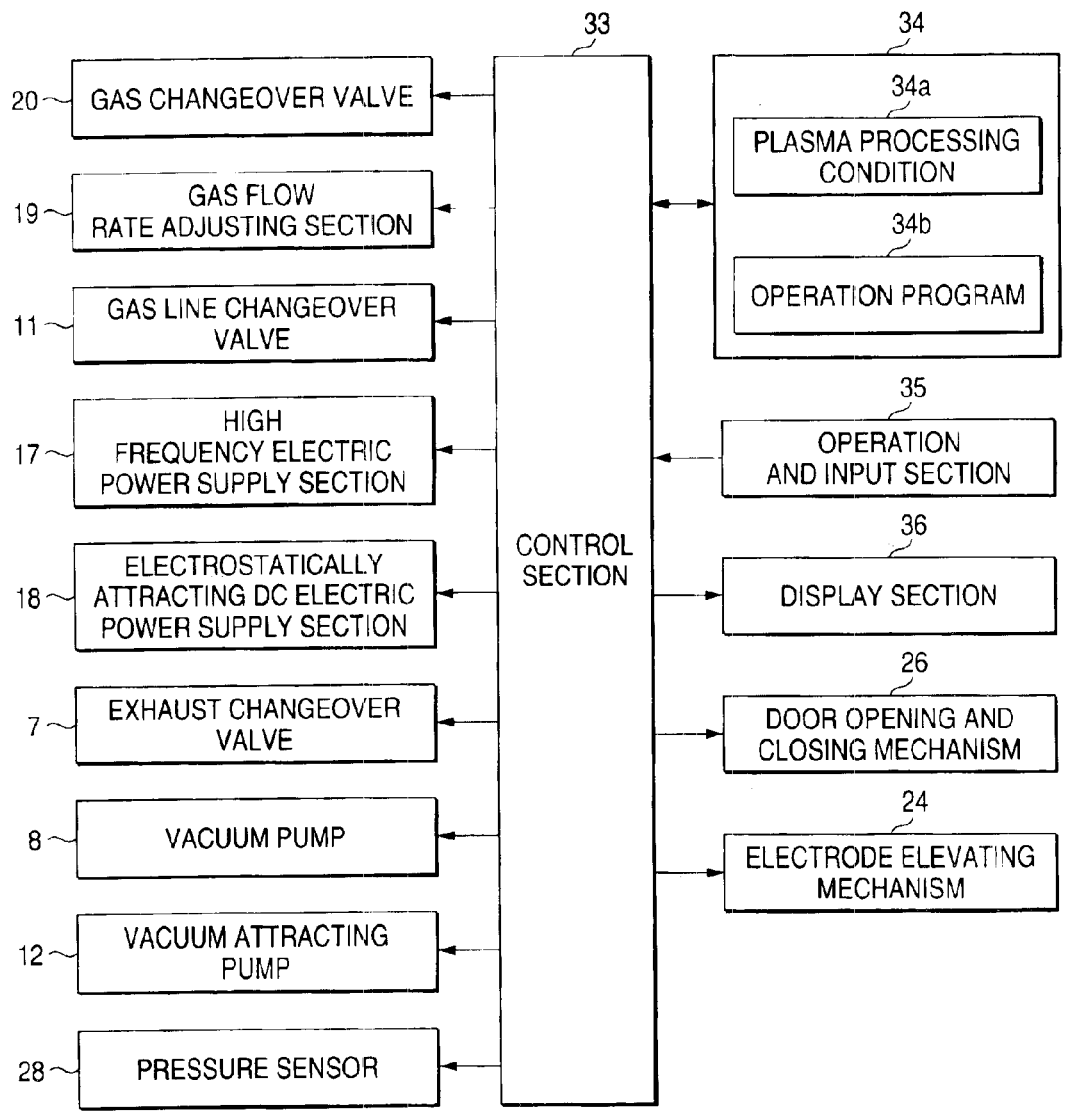
FIG. 4 is a block diagram showing a constitution of a control system of the plasma processing apparatus of the embodiment of the present invention.
Figure 5:
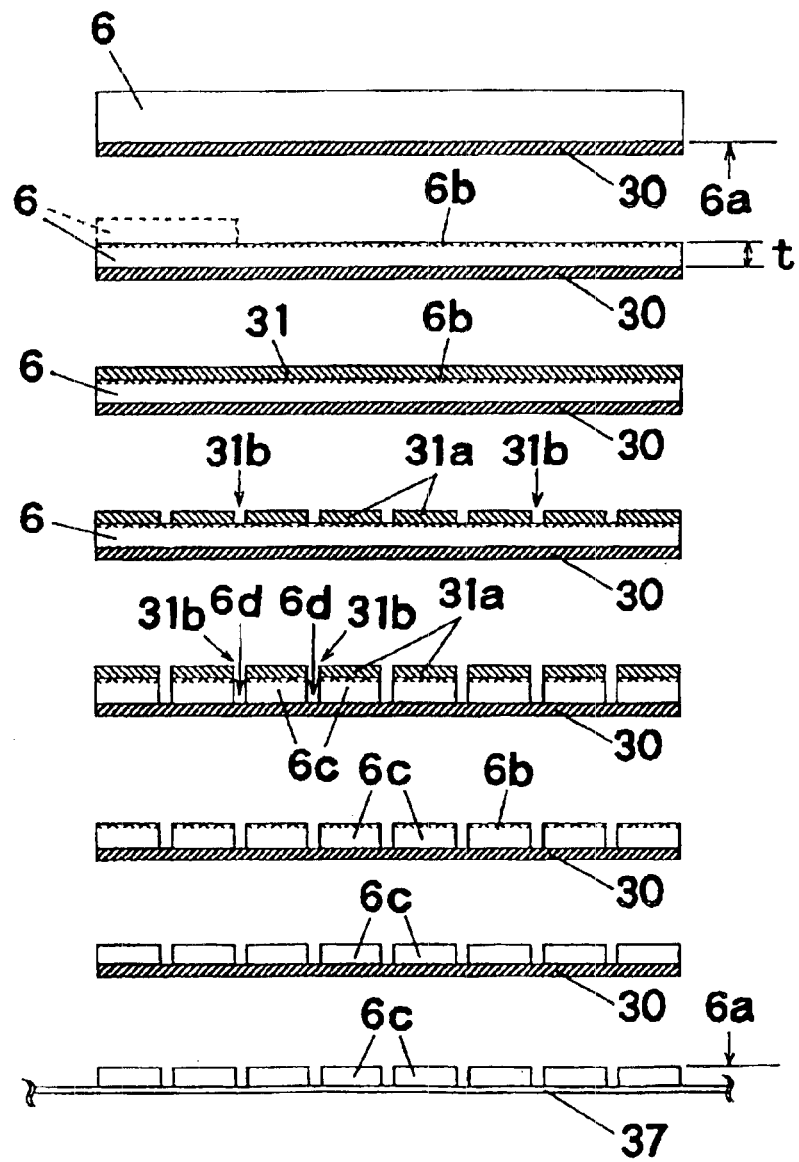
FIGS. 5(a) to 5(h) are schematic illustration for explaining a process of method of manufacturing a semiconductor device of the embodiment of the present invention.
Figure 6:
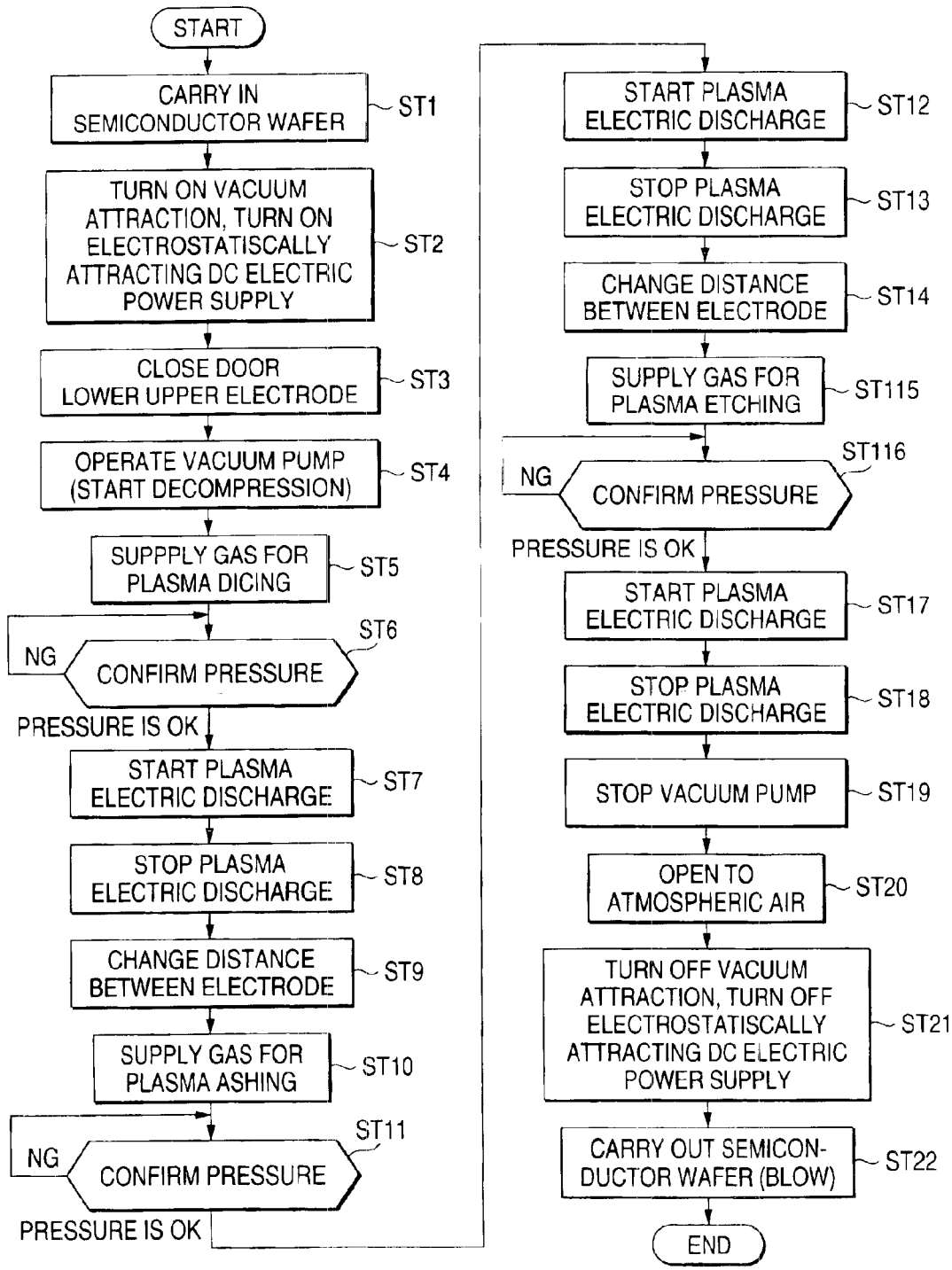
FIG. 6 is a flow chart of the plasma processing method of the embodiment of the present invention.

Next, referring to the drawings, an embodiment of the present invention will be explained below. FIG. 1 is a cross sectional side view of a plasma processing apparatus of an embodiment of the present invention, FIG. 2 is a partially cross sectional view of a lower electrode of the plasma processing apparatus of the embodiment of the present invention, FIG. 3 is a cross sectional view of the plasma processing apparatus of the embodiment of the present invention, FIG. 4 is a block diagram showing a constitution of a control system of the plasma processing apparatus of the embodiment of the present invention, FIG. 5 is a schematic illustration for explaining a process of method of manufacturing a semiconductor device of the embodiment of the present invention, FIG. 6 is a flow chart of the plasma processing method of the embodiment of the present invention, FIGS. 7, 8, 9 and 10 are cross sectional side views of the plasma processing apparatus of the embodiment of the present invention, and FIG. 11 is a data table showing a plasma processing condition in the plasma processing of the embodiment of the present invention.

First, referring to FIGS. 1 to 4, the plasma processing apparatus will be explained below. This plasma processing apparatus is used in the manufacturing process of a semiconductor device obtained in such a manner that a semiconductor wafer, on the circuit forming face (the first face) of which a plurality of semiconductor elements are formed, is divided into individual piece of the semiconductor elements so as to obtain a semiconductor device, the thickness of which is not more than 100 μm.

In the manufacturing process of this semiconductor device, first of all, a protective sheet made of material, which is difficult to be plasma-etched compared with silicon that is a primary material of the semiconductor, is attached to the circuit forming face of the semiconductor wafer. On the reverse face opposite side to the circuit forming face of the semiconductor wafer, a mask to determine cutting lines used for dividing the semiconductor wafer into individual pieces of the semiconductor elements is formed. The steps of plasma dicing, removing the mask and removing the microcracks are performed on the above semiconductor wafer by the present plasma processing apparatus.

In FIG. 1, inside the vacuum chamber 1, there is provided a processing chamber 2 for carrying out plasma processing on the semiconductor wafer. By this processing chamber 2, it is possible to form a tightly sealed space for generating plasma in the state of reduced pressure. In a lower portion inside the processing chamber 2, the lower electrode 3 (the first electrode) is arranged. In an upper portion of the lower electrode 3, the upper electrode 4 (the second electrode) is arranged being opposed to the lower electrode 3. The lower electrode 3 and the upper electrode 4 are respectively formed into a cylindrical shape and arranged in the processing chamber 2 concentrically with each other.

The lower electrode 3 is arranged in such a manner that the lower electrode 3 is surrounded by the two layers of insulating bodies 5A, 5B which are attached so that the bottom portion of the processing chamber 2 can be filled with the insulating bodies 5A, 5B and that an upper face of the lower electrode 3 for holding the object to be processed at the central portion of the bottom of the processing chamber 2 is exposed and fixed. The lower electrode 3 is made of conductive material such as aluminum. The profile of the lower electrode 3 is formed in such a manner that the supporting portion 3b is extended downward from the disk-shaped electrode portion 3a. When the supporting portion 3b is held by the vacuum chamber 1 via the insulating material 5C, the lower electrode 3 is attached being electrically insulated.

The upper electrode 4 is made of conductive material such as aluminum in the same manner as that of the lower electrode 3. The support portion 4b is extended upward from the disk-shaped electrode portion 4a. The support portion 4b is electrically continued to the vacuum chamber 1 and can be elevated by the electrode elevating mechanism 24 shown in FIG. 7. Under the condition that the upper electrode 4 is lowered, an electric discharge space for generating a plasma electric discharge used for plasma processing is formed between the upper electrode 4 and the lower electrode 3. The electrode elevating mechanism 24 functions as an electrode distance changing means. When the upper electrode 4 is elevated by the electrode elevating mechanism 24, electrode distance D between the lower electrode 3 and the upper electrode 4 shown in FIG. 2 can be changed.

Next, explanations will be made into the structure of the lower electrode 3 and the semiconductor wafer to be processed. An upper face of the electrode portion 3a of the lower electrode 3 is a plane-shaped holding face (plane) on which the semiconductor wafer is put. In an outer peripheral portion of the holding face, there is provided an insulating coating layer 3f. The insulating coating layer 3f is made of ceramics such as aluminum. Under the condition that the lower electrode 3 is attached in the vacuum chamber 1, as shown in FIG. 1, the outer peripheral portion of the insulating coating layer 3f is partially covered with the insulating body 5A. Due to the above structure, the outer peripheral portion of the lower electrode 3 is insulated from plasma generated in the electric discharge space 2b, so that the occurrence of an abnormal electric discharge can be prevented.

FIG. 2 is a view showing a state in which the semiconductor wafer 6 before the start of plasma dicing is put on the lower electrode 3. The semiconductor wafer 6 is a semiconductor substrate, the primary component of which is silicon. The protective sheet 30 is attached to the circuit forming face (the first face) of the surface (the lower face in FIG. 2) of the semiconductor wafer 6. Under the condition that the semiconductor wafer 6 is put on the lower electrode 3, the protective sheet 30 is tightly contacted with the holding face 3g of the electrode portion 3a.

The protective sheet 30 is composed of an insulating layer, the thickness of which is approximately 100 μm, made of insulating resin such as polyimide. The protective sheet 30 is detachably attached to the circuit forming face of the semiconductor wafer 6 by adhesive. When the semiconductor wafer 6 to which the protective sheet 30 is attached is held by the lower electrode 3, this insulating layer functions as dielectrics in the case of electrostatically attracting the semiconductor wafer 6 to the holding face 3g as described later.

Concerning the material of the protective sheet 30, material difficult to be etched compared with silicon, which is the main component material of the semiconductor wafer in the process of plasma dicing, is selected. Due to the foregoing, even if the etching rate of the semiconductor wafer partially fluctuates because the etching rate distribution by plasma is not uniform in the process of plasma dicing, the protective sheet 30 functions as an etching stop layer.

On the reverse face (the second face) on the opposite side (the upper side in FIG. 2) to the circuit forming face, a mask for determining the cutting lines in the process of plasma dicing described later is formed. This mask is formed when patterning is performed with a resist film after the reverse face is machined as described later. Due to the foregoing, a region except for the portion of the cutting line 31b, which is an object of plasma etching, is covered with the resin film 31a.

As shown in FIG. 2, in the lower electrode 3, there are provided a plurality of attracting holes 3e which are open to the holding face 3g, and these attracting holes 3e are communicated with the suction holes 3c provided in the lower electrode 3. As shown in FIG. 1, the suction holes 3c are connected to the vacuum suction pump 12 via the gas line changeover valve 11. The gas line changeover valve 11 is connected to the N₂ gas supply section 13 for supplying nitrogen gas. When gas line changeover valve 11 is changed over, the suction holes 3c can be connected being selectively changed over between the vacuum suction pump 12 and the $N_2$ gas supply section 13.

When the vacuum pump 12 is driven under the condition that the suction holes 3c are communicated with the vacuum suction pump 12, vacuum suction is performed from the attracting holes 3e and the semiconductor wafer 6, which is put on the lower electrode 3, is attracted by vacuum and held. Accordingly, the attracting holes 3e, the suction holes 3c and the vacuum suction pump 12 compose the attracting and holding means for holding the semiconductor wafer 6 under the condition that the protective sheet 30 is tightly contacted with the holding face 3g of the electrode portion 3a when vacuum suction is performed from the attracting holes 3e which are open to the holding face 3g of the lower electrode 3.

When the suction holes 3c are connected to the $N_2$ gas supply section 13, $N_2$ gas can be blown out from the attracting holes 3e to the lower face of the protective sheet 30. As described later, this $N_2$ gas, which is blown out from the attracting holes 3e to the lower face of the protective sheet 30, is blown out for the object of forcibly detaching the protective sheet 30 from the holding face 3g.

In the lower electrode 3, there is provided a coolant flow passage 3d in which coolant used for cooling flows. The coolant flow passage 3d is connected to the cooling mechanism 10. When the cooling mechanism 10 is driven, coolant such as cooling water circulates in the coolant flow passage 3d. Therefore, the lower electrode 3 and the protective sheet 30 on the lower electrode 3, the temperatures of which are raised by heat generated in the process of plasma processing, are cooled by the circulating coolant. The coolant flow passage 3d and the cooling mechanism 10 compose the cooling means for cooling the lower electrode 3.

The exhaust port 1a, which is communicated with the processing chamber 2, is connected to the vacuum pump 8 via the exhaust changeover valve 7. When the exhaust changeover valve 7 is changed over and the vacuum pump 8 is driven, the inside of the processing chamber 2 of the vacuum chamber 1 is exhausted by vacuum, so that the pressure in the processing chamber 2 can be reduced. The processing chamber 2 is provided with a pressure sensor 28 which is omitted in FIG. 1 and shown in FIG. 4. When the control section 33 shown in FIG. 4 described later controls the vacuum pump 8 according to the result of measuring the pressure by this pressure sensor 28, the pressure in the processing chamber 2 can be reduced to a desired value. The vacuum pump 8 composes a pressure reducing means for reducing the pressure in the processing chamber 2 to a desired value. When the exhaust changeover valve 7 is changed over to the atmospheric air-side, the atmosphere is introduced into the processing chamber 2, and the pressure in the processing chamber 2 can be returned to the atmospheric pressure.

Next, the upper electrodes 4 will be explained in detail. The upper electrodes 4 includes: a central electrode 4a; and an extending portion 4f made of insulating material which surrounds the electrode portion 4a and extends to the outer circumferential portion of the central electrode 4a. The profile of the extending portion 4f is larger than that of the lower electrode 3 and arranged being extended outside the lower electrode 3. At the central portion on the lower face of the upper electrode 4, there is provided a gas blowing portion 4e.

The gas blowing portion 4e supplies gas for generating plasma which is used for generating plasma electric discharge in the electric discharge space formed between the upper electrode 4 and the lower electrode 3. The gas blowing portion 4e is a circular plate member made of porous material having a large number of minute holes in it. Gas for generating plasma is uniformly blown out from the gas staying space 4g into the electric discharge space via the minute holes so that gas can be uniformly supplied.

In the support portion 4b, there is provided a gas supply hole 4c communicating with the gas staying space 4g. The gas supply hole 4c is connected to the first plasma generating gas supply section 21, the second plasma generating gas supply section 22 and the third plasma generating gas supply section 23 via the gas flow rate adjusting section 19 and the gas changeover valve 20. The first plasma generating gas supply section 21 and the third plasma generating gas supply section 23 supply mixed gas containing fluorine gas such as mixed gas in which sulfur hexafluoride ($SF_6$) or carbon tetrafluoride ($CF_4$) is mixed with helium gas. The second plasma generating gas supply section 22 supplies gas containing oxygen gas ($O_2$).

When the gas changeover valve 20 is changed over, either the first plasma generating gas supply section 21, the second plasma generating gas supply section 22 or the third plasma generating gas supply section 23 can supply the plasma generating gas from the gas blowing portion 4e into the electric discharge space. Accordingly, the first plasma generating gas supply section 21, the second plasma generating gas supply section 22, the third plasma generating gas supply section 23 and the gas changeover valve 20 compose the plasma generating gas supply means for selectively supplying a plurality of types of gases into the processing chamber 2.

In the above plasma generating gas supply system, when the gas flow rate adjusting section 19 is controlled according to a command sent from the control section 33, a flow rate of gas supplied into the electric discharge space can be arbitrarily adjusted. Due to the foregoing, pressure in the processing chamber 2, into which plasma generating gas is supplied, is controlled according to the plasma processing condition, which has been previously set, and the pressure in the processing chamber 2 detected by the pressure sensor 28. Accordingly, the gas flow rate adjusting section 19 composes the pressure control means for controlling the pressure in the processing chamber 2.

In this connection, concerning the pressure control means for controlling the pressure in the processing chamber 2, the prior art except for the above method, in which the flow rate of gas supplied into the processing chamber 2 is adjusted, may be used, for example, the method, in which a volume of exhaust gas discharged outside from the vacuum chamber 2 is controlled, may be used. In this method, the vacuum pump 8 to be used may be of the variable capacity type, and an exhausting capacity of the vacuum pump 8 may be controlled by the control section 33. Alternatively, an opening degree adjusting valve, the opening degree of which can be freely adjusted, is arranged in the exhaust hole 1a, and this opening degree adjusting valve may be controlled by the control section 33.

The lower electrode 3 is electrically connected to the high frequency electric power supply section 17 via the matching circuit 16. When the high frequency electric power supply section 17 is driven, a high frequency voltage is supplied between the upper electrode 4, which is electrically continued to the vacuum chamber 1 grounded to the grounding section 9, and the lower electrode 3. Due to the foregoing, plasma electric discharge is generated in the electric discharge space between the upper electrode 4 and the lower electrode 3. Accordingly, the plasma generating gas supplied to the processing chamber 2 is transferred into the state of plasma. The matching circuit 16 performs impedance matching between the plasma electric discharge circuit in the processing chamber 2 and the high frequency electric power supply section 17 in the case of generating this plasma.

The lower electrode 3 is connected to the electrostatically attracting DC electric power supply section 18 via RF filter 15. When the electrostatically attracting DC electric power supply section 18 is driven, as shown in FIG. 3(a), negative electric charges are accumulated on the surface of the lower electrode 3. When plasma is generated in the processing chamber 2 by driving the high frequency electric power supply section 17 as shown by the dotted portion 31 in FIG. 3(b), the DC current supplying circuit 32 for connecting the semiconductor wafer 6, which is put on the holding face 3g via the protective sheet 30, to the grounding section 9 is formed in the processing chamber 2 via the plasma. Due to the foregoing, a closed circuit is formed in which the lower electrode 3, RF filter 15, the electrostatically attracting DC electric power supply section 18, the grounding section 9, the plasma and the semiconductor wafer 6 are successively connected in this order, and positive electric charges are accumulated on the semiconductor wafer 6.

Coulomb's force acts between the negative electric charges, which are accumulated on the holding face 3g of the lower electrode 3 made of conductive material, and the positive electric charges which are accumulated on the semiconductor wafer 6. By this Coulomb's force, the semiconductor wafer 6 is held by the lower electrode 3. At this time, RF filter 15 prevents the high frequency voltage of the high frequency electric power supply section 17 from being directly given to the electrostatically attracting DC electric power supply section 18. In this connection, the polarity of the electrostatically attracting DC electric power supply section 18 may be reversed.

In the above constitution, the electrostatically attracting DC electric power supply section 18 composes the DC voltage supplying means for electrostatically attracting the semiconductor wafer 6 by utilizing Coulomb's force acting between the semiconductor wafer 6 and the holding face 3g of the lower electrode 3, which are separate from each other by the protective sheet 30, when DC voltage is supplied upon the lower electrode 3. That is, concerning the holding means for holding the semiconductor wafer 6 on the lower electrode 3, the vacuum attracting means for attracting the protective sheet 30 via the plurality of attracting holes 3e, which are open to the holding face 3g, by vacuum and the DC voltage supplying means described above are provided, and these two types of means are properly used.

In the upper electrode 4, there are provided a coolant flow passage 4d. The coolant flow passage 4d is connected to the cooling mechanism 10. When the cooling mechanism 10 is driven, coolant such cooling water circulates in the coolant flow passage 4d. Due to the foregoing, the upper electrode 4, the temperature of which is raised by the heat generated in the plasma processing, is cooled.

Figure 7:
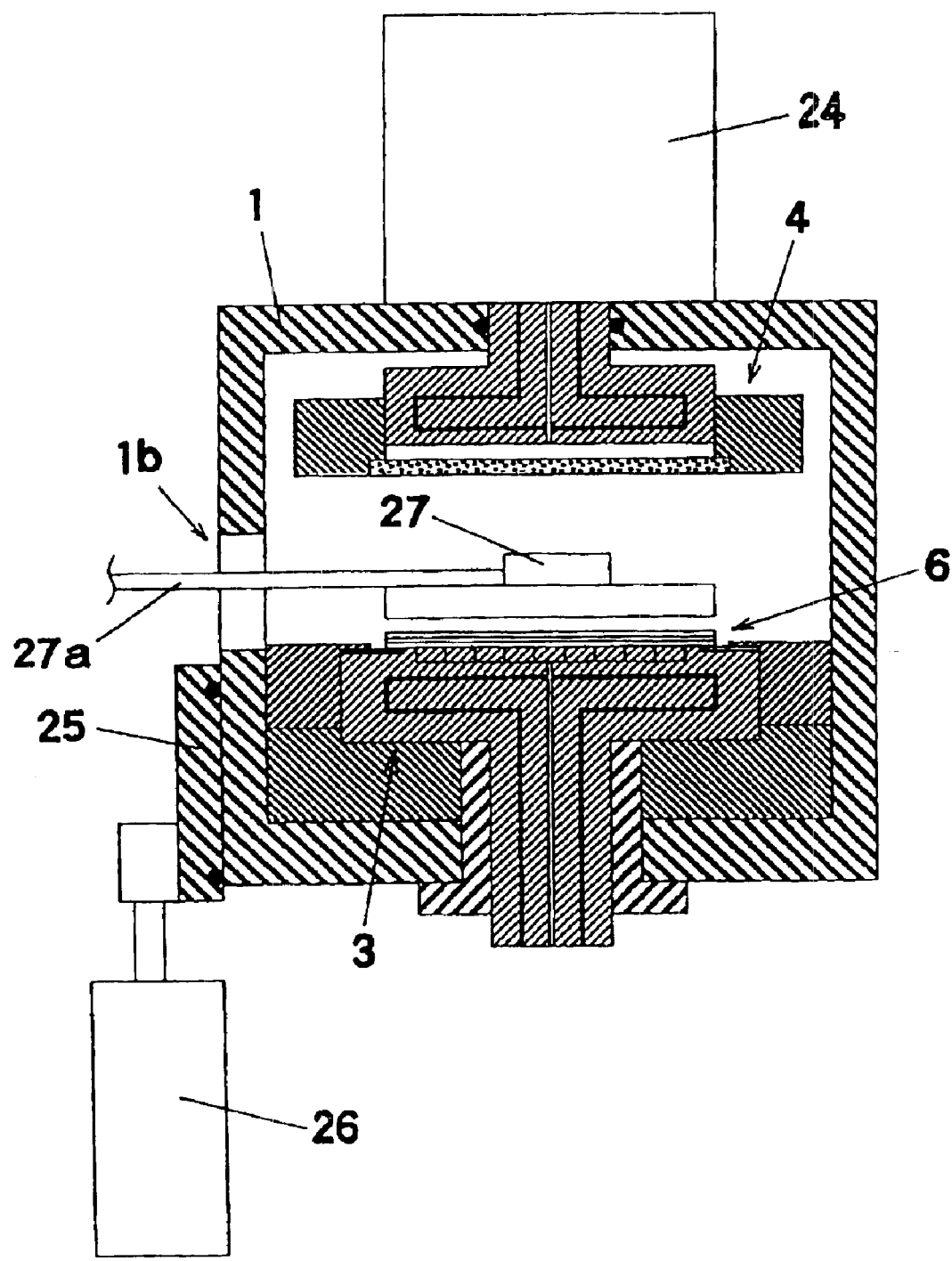
FIG. 7 is cross sectional side view of the plasma processing apparatus of the embodiment of the present invention.

On the side of the processing chamber 2, there is provided an opening portion 1b for taking in and out an object to be processed as shown in FIG. 7. Outside the opening portion 1b, there is provided a door 25 elevated by the door opening and closing mechanism 26. When the door 25 is elevated, the opening portion 1b can be opened and closed. FIG. 7 is a view showing a state in which the door 25 is lowered and the opening portion 1b is opened and the semiconductor wafer 6 is taken in and out.

In the case of taking in and out the semiconductor wafer 6, the upper electrode 4 is raised by the electrode elevating mechanism 24, and a conveyance space is ensured on the lower electrode 3. Under this condition, the attracting head 27, which is attracting and holding the semiconductor wafer 6, is made to proceed into the processing chamber 2 via the opening portion 1b by operating the arm 27a. In this way, the semiconductor wafer 6 is conveyed onto the lower electrode 3, and the semiconductor wafer 6 (semiconductor device), which has been processed, is conveyed out from the lower electrode 3.

Next, referring to FIG. 4, explanations will be made into the constitution of the control system of the plasma processing apparatus. In FIG. 4, the control section 33 is connected to the storage section 34 for storing various data and processing programs. The storage section 34 stores the plasma processing condition 34a and the plasma processing operation program 34b. The operation inputting section 35 is an inputting means such as a key board and inputs data such as a plasma processing condition and an operation command. The display section 36 is a display device which displays a guiding image plane in the case of inputting for operation.

Referring to the data table shown in FIG. 11, the plasma processing conditions 34a will be explained below. The plasma processing conditions 34a include the first, the second and the third condition respectively corresponding to the plasma dicing process, the ashing process for removing the mask and the plasma stress relief process for removing the micro-cracks. As shown in FIG. 11, the plasma processing conditions are composed of RF power [W], which shows a high frequency electric power supply output, pressure [Pa] and electrode distance [mm]. The most appropriate condition data for each process is stored in the storage section 34 with respect to each item described above.

Concerning the allowable ranges to be allowed as the condition data in the process of plasma dicing, the allowable range of RF power is 500 to 3000 [W], the allowable range of the processing pressure is 5 to 300 [Pa] and the allowable range of the electrode distance is 5 to 50 [mm]. Numeral values considered to be most appropriate in the above ranges are stored in the storage section 34 as the first condition.

Concerning the allowable range to be allowed as the condition data in the process of ashing, the allowable range of RF power is 100 to 1000 [W], the allowable range of the processing pressure is 5 to 100 [Pa] and the allowable range of the electrode distance is 50 to 100 [mm]. Numeral values considered to be most appropriate in the above ranges are stored in the storage section 34 as the second condition.

Concerning the allowable range to be allowed as the condition data in the process of plasma stress relief, the allowable range of RF power is 500 to 3000 [W], the allowable range of the processing pressure is 300 to 2000 [Pa] and the allowable range of the electrode distance is 50 to 20 [mm]. Numeral values considered to be most appropriate in the above ranges are stored in the storage section 34 as the third condition.

In this connection, in the case where RF power is not changed in the processes of plasma dicing, ashing and plasma stress relief, the RF power conditions may not be individually set as the first to the third condition.

In the plasma processing operation carried out according to the operation program 34b, the control section 33 controls the gas changeover valve 20, gas flow rate adjusting section 19, gas line changeover valve 11, high frequency electric power supply section 17, electrostatically attracting DC electric power supply section 18, exhaust changeover valve 7, vacuum pump 8, vacuum attracting pump 12, door opening and closing mechanism 26 and electrode elevating mechanism 24.

At this time, pressure is set when the control section 33 controls the gas flow rate adjusting section 19 according to the pressure detection result of the pressure sensor 28 and the above plasma processing condition 34*a*. In the same manner, the electrode distance D and the high frequency electric power supply output are set at the plasma processing condition when the control section 33 controls the high frequency electric power supply section 17 and the electrode elevating mechanism 24.

The plasma processing apparatus is composed as described above. Referring to FIG. 5 and the other drawings, explanations will be made into the method of manufacturing the semiconductor device, in which the above plasma processing apparatus is used, and the plasma processing method carried out in the process of the method of manufacturing this semiconductor device.

First, in FIG. 5(*a*), reference numeral 6 is a semiconductor wafer, which is before the processing of reducing the thickness, on which a plurality of semiconductor elements are formed. In this state, the thickness of the semiconductor wafer exceeds 100 $\mu$m. Before the processing of reducing the thickness is perfored, the protective sheet 30 capable of being peeled off by using an adhesive member is attached to the circuit forming face (the first face) of the semiconductor wafer 6 (sheet attaching process). In this case, the profile of the protective sheet 30 is the same as that of the semiconductor wafer 6 so that the protective sheet 30 can cover the overall circuit forming face 6*a* and can not protrude outside the semiconductor wafer 6. Due to the foregoing, the protective sheet 30 is not exposed to plasma in the plasma processing carried out later. Therefore, it is possible to prevent the protective sheet 30 from being damaged by plasma.

Next, as shown in FIG. 5(*b*), the back face (the second face) on the opposite side to the circuit forming face is shaved by machining. The thickness t of the semiconductor wafer is reduced to a value not more than 100 $\mu$m (the thickness reducing process). In this thickness reducing process, the micro-crack layer 6*b* is generated on the machined face on the reverse side. Since this micro-crack layer 6*b* lowers the mechanical strength of the semiconductor wafer 6, it is removed in the process conducted later.

Next, on the reverse face after the completion of the thickness reducing process, the mask is formed so as to determine the cutting lines used for dividing the semiconductor wafer 6 into individual pieces of the semiconductor elements (the mask forming process). First, as shown in FIG. 5(*c*), the resist film 31 made of resin is formed on the reverse face so that it can cover the overall face of the semiconductor wafer 6. Next, as shown in FIG. 5(*d*), patterning is conducted on the resist film 31 by means of photolithography so as to remove portions of the resist film 31 corresponding to the cutting lines 31*b*. Due to the foregoing, on the reverse face of the semiconductor wafer 6, the mask is formed, the region except for the portions of the cutting lines 31*b* of which is covered with the resist film 31*a*. The semiconductor wafer 6 having the mask in this state becomes an object to be processed by means of plasma processing.

Referring to the flow chart shown in FIG. 6 and also referring to each drawing, the plasma processing method, the object to be processed of which is this semiconductor wafer 6 having the mask, will be explained below. First, as shown in FIG. 7, the semiconductor wafer 6 having the mask is conveyed into the processing chamber 2 (ST1). In the case of this conveyance operation, while the upper electrode 4 is being raised by the electrode elevating mechanism 24, the arm 27*a* is operated, and the semiconductor wafer 6, the mask forming face side of which is held by the attracting head 27, is conveyed from the opening portion 1*b* into the processing chamber 2, and the semiconductor wafer 6 is put on the lower electrode 3.

Next, the vacuum attracting pump 12 is driven so as to attract from the attracting holes 3*e* by vacuum, and the vacuum attraction of the semiconductor wafer 6 is turned on and the electrostatically attracting DC electric power supply section 18 is turned on (ST2). By this vacuum attraction, the semiconductor wafer 6 is held by the lower electrode 3 while the protective sheet 30 is being tightly contacted with the holding face 3*g* of the lower electrode 3 (the wafer holding process).

Figure 8:
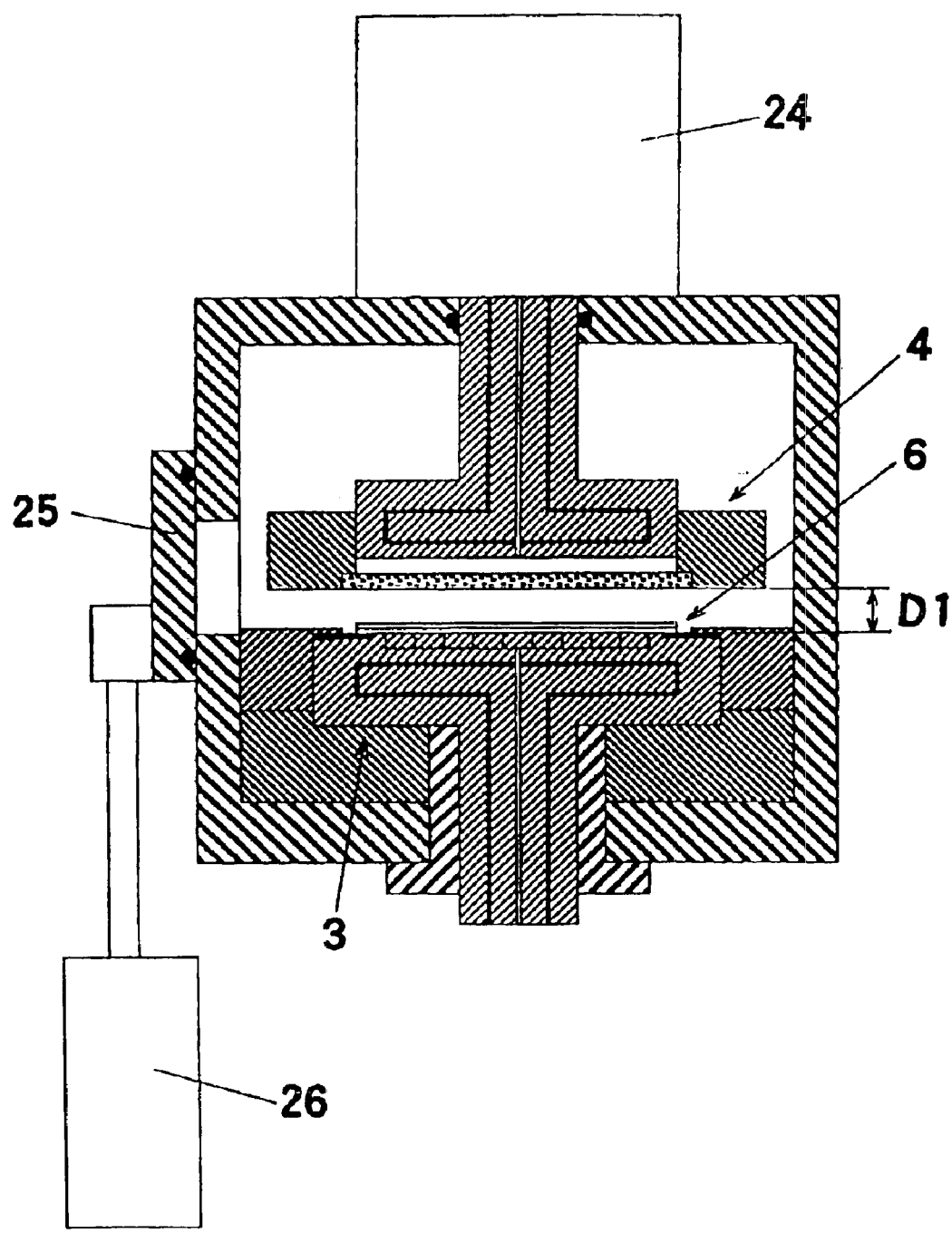
FIG. 8 is cross sectional side view of the plasma processing apparatus of the embodiment of the present invention.

After that, as shown in FIG. 8, the door 25 is closed and the upper electrode 4 is lowered (ST3). Due to the foregoing, the electrode distance between the upper electrode 4 and the lower electrode 3 is set at the electrode distance D1 shown by the first condition of the plasma processing condition. Next, the vacuum pump 8 is set in motion so as to start decompressing the processing chamber 2 (ST4). When the degree of vacuum in the processing chamber 2 has reached a predetermined value, the plasma dicing gas (the first plasma generating gas) composed of mixed gas containing sulfur hexafluoride and helium is supplied (ST5).

In the gas supplying process, the pressure of gas in the processing chamber 2 is detected and compared with the plasma processing condition, and it is confirmed that the pressure has reached the value shown by the first condition (ST6). That is, in steps (ST3) and (ST6), the electrode distance D between the lower electrode 3 and the upper electrode 4, which is opposed to the lower electrode 3, and the pressure in the processing chamber 2 are set at the first condition of the plasma processing condition (the first condition setting step).

After the condition setting has been completed, the high frequency electric power supply section 18 is driven and the high frequency voltage is supplied between the upper electrode 4 and the lower electrode 3 so as to start plasma electric discharge (ST7). Due to the foregoing, the first plasma generating gas containing fluorine gas is transferred into the plasma state in the electric discharge space between the upper electrode 4 and the lower electrode 3. By the generation of plasma, plasma of fluorine gas such as sulfur hexafluoride is exposed from the mask side (the resist film 31*a* side) to the semiconductor wafer 6. By this irradiation of plasma, only the portions of silicon of primary material of the semiconductor wafer 6, which are the portions of the cutting lines 31*b* not covered with the resist film 31*a*, are plasma-etched by plasma of fluorine gas.

At the same time, a DC electric current supplying circuit is formed in the electric discharge space between the upper electrode 4 and the lower electrode 3 as shown in FIG. 3. Due to the foregoing, an electrostatically attracting force is generated between the lower electrode 3 and the semiconductor wafer 6, so that the semiconductor wafer 6 is held on the lower electrode 3 by the electrostatically attracting force. Therefore, the protective sheet 30 is tightly contacted with the holding face 3*g* of the lower electrode 3. Accordingly, the semiconductor wafer 6 can be stably held in the process of plasma processing. At the same time, the protective sheet

30 can be cooled by the cooling function provided by the lower electrode 3, so that the occurrence of heat damage generated by plasma electric discharge can be prevented.

When this plasma etching proceeds, as shown in FIG. 5(*e*), the cutting groove 6*d* is formed only in a portion of the cutting line 31*b*. When the depth of this cutting groove 6*d* reaches the overall thickness of the semiconductor wafer 6, the semiconductor wafer 6 is divided into individual pieces of the semiconductor elements 6*c* as shown in FIG. 5(*e*) (the plasma dicing step). Electric power of the high frequency electric power supply is determined according to the first condition which is set in the range of 500 to 3000 [W]. When a predetermined plasma processing time has passed through and the operation of plasma dicing has been completed, plasma electric discharge is stopped (ST8).

Figure 9:
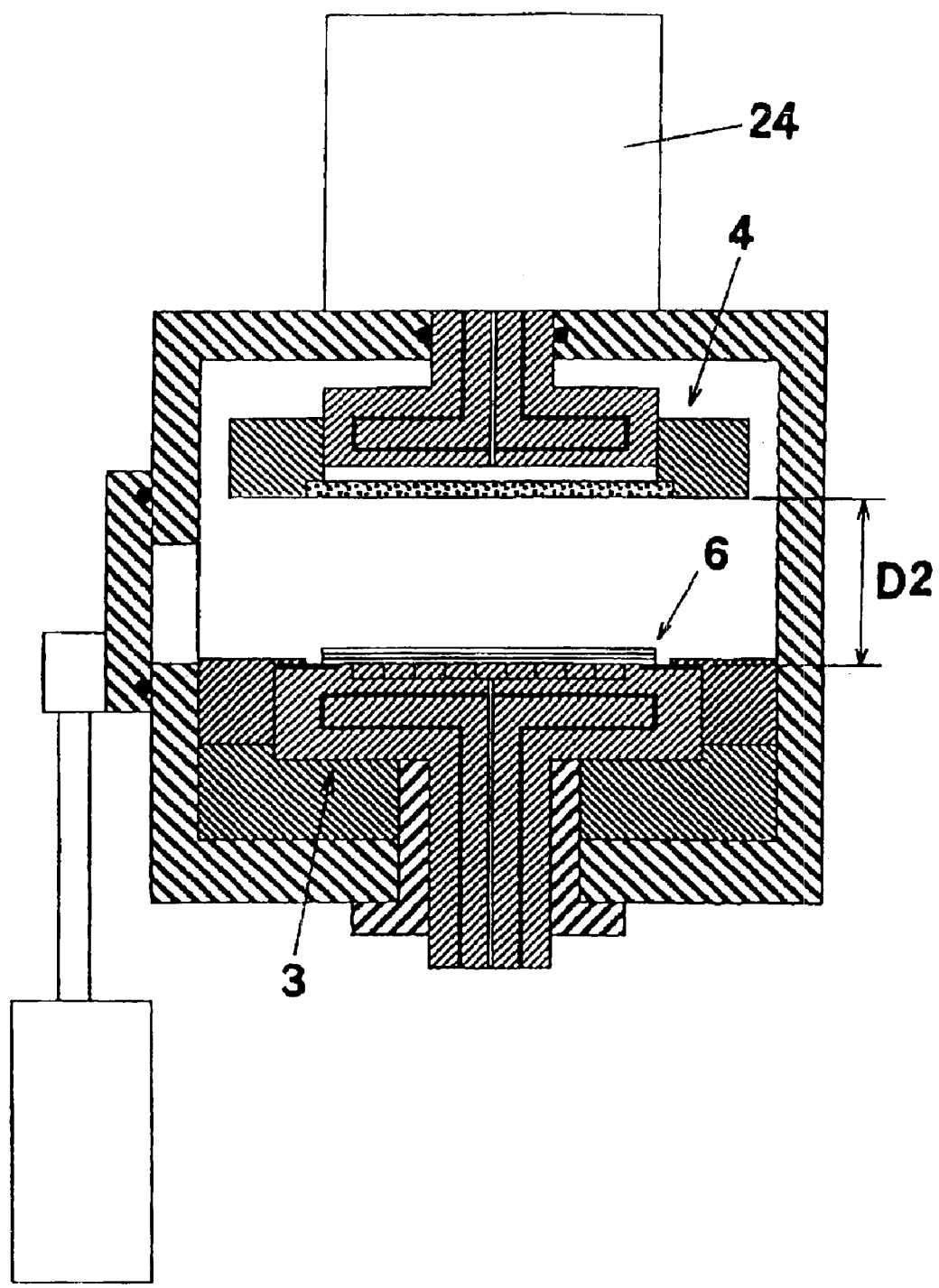
FIG. 9 is cross sectional side view of the plasma processing apparatus of the embodiment of the present invention.

After that, the distance between the electrodes is changed so that the process can be transferred to the plasma ashing step (ST9). As shown in FIG. 9, the upper electrode 4 is raised, and the distance between the upper electrode 4 and the lower electrode 3 is set at the electrode distance D2 shown by the second condition of the plasma processing condition. The electrode distance D2 in the case of removing the mask is set to be larger than the electrode distance D1 in the case of the above plasma dicing and the electrode distance D3 in the case of removing the micro-cracks described later.

Next, the plasma ashing gas (the second plasma generating gas) is supplied from the second plasma generating gas supply section 22 (ST10). Then, the pressure of gas in the processing chamber 2 in the process of supplying gas is detected and compared with the plasma processing condition so as to confirm that the pressure has reached the pressure shown by the second condition (ST11). That is, in (ST9) and (ST11), the electrode distance and the pressure in the processing chamber 2 are set at the second condition of the plasma processing (the second condition setting step).

After the setting of the condition has been completed, the high frequency electric power supply section 18 is driven and a high frequency voltage is supplied between the upper electrode 4 and the lower electrode 3, so that plasma electric discharge is started (ST12). Due to the foregoing, the second plasma generating gas containing oxygen gas is transferred into the plasma state in the electric discharge space between the upper electrode 4 and the lower electrode 3. When the thus generated plasma acts on the mask formation face side (the second face side) of the semiconductor wafer 6, the resin film 31*a* made of organic matter is ashed by the plasma of oxygen gas.

When this ashing process proceeds, the resist film 31*a* is gradually extinguished. Finally, the mask is completely removed from the second face side of the semiconductor wafer 6 as shown in FIG. 5(*f*) (the mask removing step). Electric power of the high frequency electric power supply in this mask removing step is the second condition which has been set in the range from 100 to 1000 [W]. After the mask has been completely removed, the plasma electric discharge is stopped (ST13).

Figure 10:
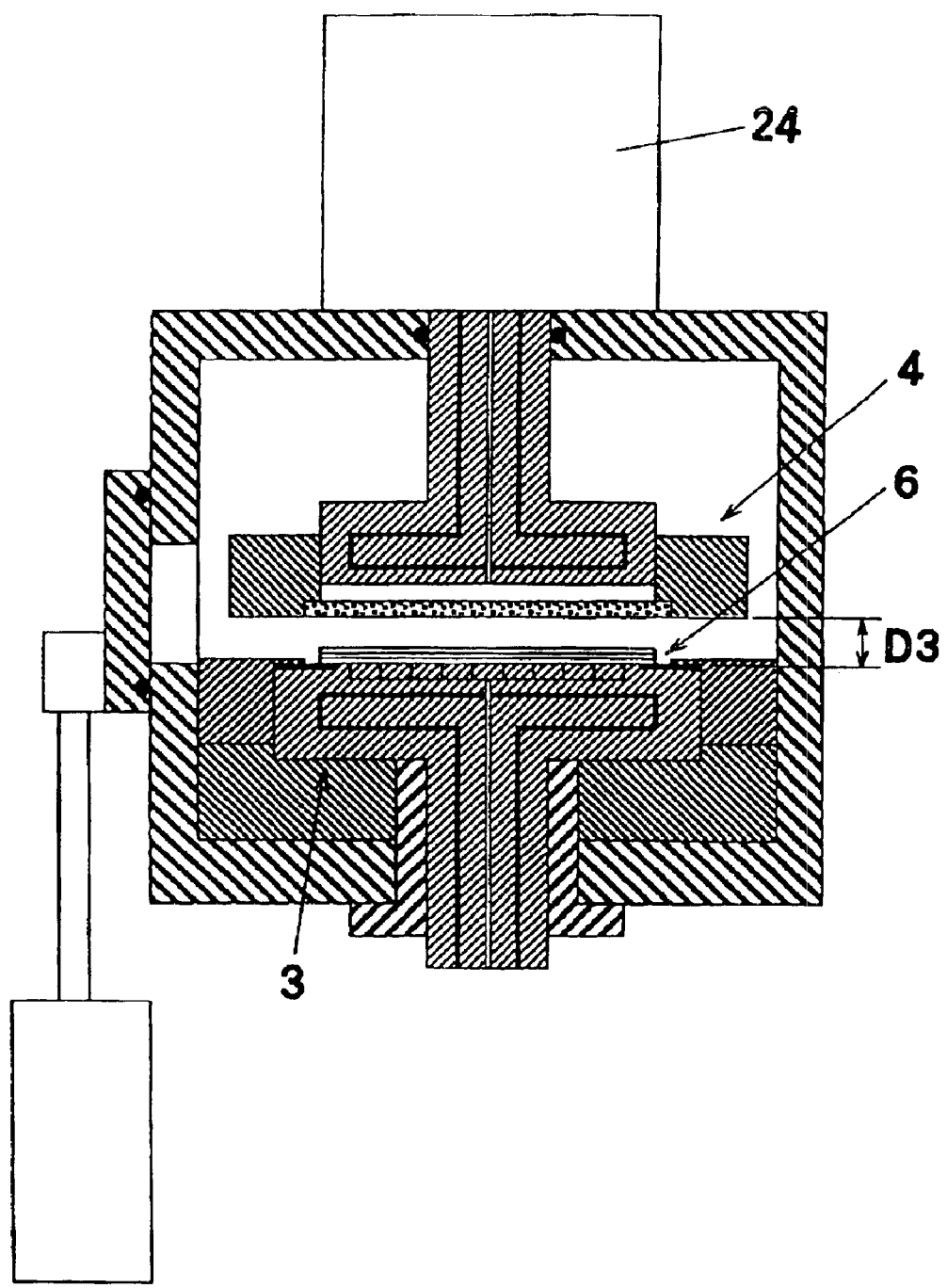
FIG. 10 is cross sectional side view of the plasma processing apparatus of the embodiment of the present invention.

After that, the distance between the electrodes is changed so that the process can be transferred into the micro-crack removing step (ST14). As shown in FIG. 10, the upper electrode 4 is lowered again, and the electrode distance between the upper electrode 4 and the lower electrode 3 is set at the electrode distance D3 shown in the third condition of the plasma processing condition.

Next, the plasma etching gas (the third plasma generating gas) for removing the micro-cracks is supplied from the third plasma generating gas supply section 23 (ST15). In this case, the same type gas as the plasma generating gas (the first plasma generating gas) used in the plasma dicing step, that is, mixed gas containing sulfur hexafluoride, which is fluoride gas, and also containing helium is used in the micro-crack removing step in the same manner. In this connection, in the case where the same type gas as the first plasma generating gas is always used as the third plasma generating gas, the third plasma generating gas supply section 23 may not be provided and the first plasma generating gas supply section 21 may be also used as the third plasma generating gas supply section 23.

Then, the pressure of gas in the processing chamber 2 in the process of supplying gas is detected and compared with the plasma processing condition so as to confirm that the pressure has reached the pressure shown by the first condition (ST16). That is, in (ST14) and (ST16), the electrode distance and the pressure in the processing chamber 2 are set at the third condition of the plasma processing (the third condition setting step).

After the setting of the condition has been completed, the high frequency electric power supply section 18 is driven and a high frequency voltage is supplied between the upper electrode 4 and the lower electrode 3, so that plasma electric discharge is started (ST17).

Due to the foregoing, the third plasma generating gas containing fluorine gas is transferred into the plasma state in the electric discharge space between the upper electrode 4 and the lower electrode 3.

When the thus generated plasma acts on the semiconductor wafer 6, as shown in FIG. 5(*g*), the micro-crack layer 6*b* remaining on the face (the second face) on the mask removing side of the semiconductor element 6*c* divided into individual pieces is removed by plasma etching (the micro-crack removing step). Electric power of the high frequency electric power supply in the micro-crack removing step is the third condition which is set in the range from 50 to 3000 [W]. When a predetermined time has passed through, the plasma electric discharge is stopped (ST18).

After that, operation of the vacuum pump 8 is stopped (ST19), and the exhaust changeover valve 7 is changed over so as to open to the atmospheric air (ST20). Due to the foregoing, the pressure in the processing chamber is returned to the atmospheric pressure. Then, the state of vacuum attraction is turned off, and the electrostatically attracting DC electric power supply is turned off (ST21) Due to the foregoing, the semiconductor wafer 6, which is divided into individual pieces of the semiconductor elements and attracted and held on the protective tape 30, can be released.

After that, the semiconductor wafer 6, the plasma processing of which has been completed, is conveyed out (ST22). While nitrogen gas is being blown from the attracting holes 3*e*, the semiconductor wafer 6 is attracted and held by the attracting head 27 and conveyed outside the processing chamber 2. In this way, plasma processing is completed in which the steps of plasma dicing, ashing and plasma etching are continuously carried out by the same plasma processing apparatus.

In this series of plasma processing, the protective sheet 30 is entirely covered with the semiconductor wafer 6 as described before. Therefore, the protective sheet 30 is not exposed to plasma. Accordingly, no damage is caused on the protective sheet 30, that is, no thermal deformation is caused on the protective sheet 30. Accordingly, the protective sheet 30 always comes into close contact with the holding face 3*g* and the semiconductor wafer 6 and fulfills the function of the protective sheet.

Then, the semiconductor wafer 6 conveyed out together with the protective sheet 30 is sent to the sheet peeling step, and the protective sheet 30 is peeled off from the circuit forming face of the semiconductor device which has been obtained when the semiconductor wafer 6 is divided into individual pieces of the semiconductor elements 6c (the sheet peeling step). As shown in FIG. 5(h), the protective sheet 30 is peeled off after the adhesive sheet 37 for holding is attached onto the second face of the semiconductor element 6c and each semiconductor element 6c is held on the adhesive sheet 37.

As explained above, in the method of manufacturing a semiconductor device of the present embodiment, the mask to determine the cutting lines for dividing the semiconductor wafer into individual pieces of the semiconductor elements is first formed. Then, the three processes of plasma processing, the objects of which are different from each other, are carried out on the semiconductor wafer on which this mask is formed.

The plasma dicing step in which plasma exposes from the mask side so as to carry out plasma-etching on portions of the cutting lines and divide the semiconductor wafer into individual pieces of the semiconductor elements, the mask removing step in which the mask is removed by utilizing plasma and the micro-crack removing step in which the micro-cracks generated in the thickness reducing step are removed are continuously performed in the above order.

The plasma processing apparatus for performing a series of the above plasma processing includes: a pressure control means for controlling pressure in the processing chamber; a plasma generating gas supply means for selectively supplying a plurality of types of plasma generating gases into the processing chamber; and an electrode distance changing means for changing a distance between the lower electrode and the upper electrode.

Due to the foregoing, it becomes possible to change over the plasma processing condition in the same device according to the object of processing. Therefore, the plasma dicing step in which the semiconductor wafer is divided into individual pieces of the semiconductor elements by plasma etching, the mask removing step in which the mask is removed by utilizing plasma and the micro-crack removing step in which the micro-cracks generated in the thickness reducing step can be continuously, effectively carried out by the same plasma processing apparatus.

Accordingly, various problems caused in the prior art, in which the steps of stress relief, mask formation and plasma dicing are successively carried out, can be effectively solved.

It is possible to manufacture a semiconductor device without a complicated manufacturing process in which the semiconductor wafer is taken out from the plasma processing apparatus after the completion of plasma processing for stress relief and then the mask is formed on it and the semiconductor wafer is conveyed into the plasma processing apparatus again and without causing an increase in the equipment cost of the production line and a decrease in the production efficiency. Further, it is possible to suppress the occurrence of damage of a very thin semiconductor wafer, the thickness of which is reduced by machining, when the very thin semiconductor wafer is conveyed and handled between the processes. Therefore, it becomes possible to enhance the yield of processing.

In this embodiment, there is provided an example in which the plasma dicing step is executed by utilizing one type mixed gas containing fluorine gas. However, the plasma dicing step may be executed while a plurality of types of gasses are being changed over stepwise. For example, the constitution of the plasma generating gas supply means and the process may be changed in such a manner that the layer of $SiO_2$ of the semiconductor wafer is etched by plasma of fluorine gas of hydrogen bonding and that the protective film (the passivation film) is etched by plasma of oxygen gas.

According to the method of manufacturing a semiconductor device of the present invention, a semiconductor wafer, on which a mask to determine cutting lines used for dividing a semiconductor wafer into individual pieces of semiconductor elements is formed, is subjected to the steps as follows. The semiconductor wafer is subjected to a plasma dicing step of dividing the semiconductor wafer to the individual pieces by carrying out plasma-etching on the cutting lines when the semiconductor wafer is exposed to plasma from the mask side; the semiconductor wafer is also subjected to a mask removing step of removing the mask by utilizing plasma; the semiconductor wafer is also subjected to a micro-crack removing step of removing micro-cracks, which are generated in the thickness reducing step. When these steps are continuously performed in the above order, the manufacturing process of the semiconductor device can be simplified, so that the equipment cost can be reduced and the production efficiency can be enhanced. Further, the semiconductor wafer can be prevented from being damaged while it is being conveyed and handled, and the machining yield can be enhanced.

According to the plasma processing apparatus and the plasma processing method of the present invention, the plasma processing apparatus includes: a pressure control means for controlling pressure in a processing chamber; a plasma generating gas supply section for selectively supplying a plurality of types of plasma generating gases into the processing chamber; and an electrode distance changing means for changing an electrode distance between the first electrode and the second electrode, and further a plasma dicing step of dividing a semiconductor wafer into individual pieces of semiconductor elements by plasma etching, a mask removing step of removing a mask by utilizing plasma and a micro-crack removing step of removing micro-cracks generated in the thickness reducing step can be continuously, effectively executed by the same plasma processing apparatus.

What is claimed is:

1. A method of manufacturing a semiconductor device in which a semiconductor wafer, on the first face of which a plurality of semiconductor elements are formed, is divided into individual pieces of semiconductor elements so as to obtain a semiconductor device, the thickness of which is not more than 100 $\mu$m, the method comprising:

a sheet attaching step of attaching a protective sheet, capable of being peeled off, to the first face;

a thickness reducing step of reducing the thickness of the semiconductor wafer to not more than 100 $\mu$m by shaving a second face, which is opposed to the first face, by means of machining;

a mask forming step of forming a mask for determining cutting lines to divide the semiconductor wafer into the individual pieces on the second face;

a plasma dicing step of dividing the semiconductor wafer to the individual pieces by carrying out plasma-etching on the cutting lines when the semiconductor wafer is exposed to plasma from the mask side;

a mask removing step of removing the mask by utilizing plasma;

a micro-crack removing step of removing micro-cracks, which are generated on the second face in the thickness reducing step, by carrying out plasma-etching on the second face from which the mask has been removed; and a sheet peeling step of peeling the protective sheet from each semiconductor device which has been obtained as an individual piece.

2. A method of manufacturing a semiconductor device according to claim 1, wherein the plasma dicing step, the mask removing step and the micro-crack removing step are carried out by the same plasma processing apparatus.

3. A method of manufacturing a semiconductor device according to claim 1; wherein an adhesive sheet is attached to the second face after the completion of the micro-crack removing step and then the protective sheet is peeled off.

4. A method of manufacturing a semiconductor device according to claim 1 or 2, wherein mixed gas containing at least fluorine gas is used as plasma generating gas to be used in the plasma dicing step.

5. A method of manufacturing a semiconductor device according to claim 1 or 2, wherein gas containing oxygen is used as plasma generating gas to be used in the mask removing step.

6. A method of manufacturing a semiconductor device according to claim 1 or 2, wherein the same type gas as the plasma generating gas used in the plasma dicing step is used as the plasma generating gas to be used in the micro-crack removing step.

7. A method of manufacturing a semiconductor device according to claim 1 or 2, wherein mixed gas containing at least fluorine gas is used as the plasma generating gas to be used in the micro-crack removing step.

8. A method of manufacturing a semiconductor device according to claim 7, wherein the same type gas as the plasma generating gas used in the plasma dicing step is used as the plasma generating gas to be used in the micro-crack removing step.

9. A plasma processing method in which the steps of plasma dicing, removing a mask and removing micro-cracks are executed by carrying out plasma processing on a semiconductor wafer, on the first face having semiconductor elements of which a protective sheet is attached, on the second face on the opposite side to the first face of which a mask to determine cutting lines for dividing the semiconductor wafer into individual pieces of the semiconductor elements is formed, the plasma processing method comprising:

a wafer holding step in which the semiconductor wafer is held by a first electrode under the condition that the protective sheet is tightly contacted with a plane of the first electrode in a processing chamber;

a first condition setting step in which an electrode distance between a first electrode and a second electrode, which is arranged being opposed to the first electrode, and pressure in the processing chamber are set at a first condition;

a plasma dicing step in which portions of the cutting lines are plasma-etched when a first plasma generating gas is supplied into the processing chamber and a high frequency voltage is supplied between the first electrode and the second electrode so that the first plasma generating gas is transferred into a plasma state;

a second condition setting step in which the distance between the electrodes and the pressure in the processing chamber are set at a second condition;

a mask removing step in which the mask is removed by ashing when a second plasma generating gas is supplied into the processing chamber and a high frequency voltage is supplied between the first electrode and the second electrode so that the second plasma generating gas is transferred into a plasma state;

a third condition setting step in which the distance between the electrodes and the pressure in the processing chamber are set at a third condition; and a micro-crack removing step in which micro-cracks remaining on the second face, from which the mask has been removed, are removed by plasma etching when a third plasma generating gas is supplied into the processing chamber and a high frequency voltage is supplied between the first electrode and the second electrode so that the third plasma generating gas is transferred into a plasma state.

10. A plasma processing method according to claim 9, wherein the first plasma generating gas is a mixed gas containing fluorine gas.

11. A plasma processing method according to claim 9, wherein the second plasma generating gas contains oxygen.

12. A plasma processing method according to claim 9, wherein the third plasma generating gas is a mixed gas containing fluorine gas.

13. A plasma processing method according to claim 9, wherein the first plasma generating gas and the third plasma generating gas are the same type mixed gas.

14. A plasma processing method according to claim 9, wherein the pressure in the processing chamber in the first condition is set in the range from 5 to 300 [Pa] and the electrode distance is set in the range from 5 to 50 [mm].

15. A plasma processing method according to claim 9, wherein the pressure in the processing chamber in the second condition is set in the range from 5 to 100 [Pa] and the electrode distance is set in the range from 50 to 100 [mm].

16. A plasma processing method according to claim 9, wherein the pressure in the processing chamber in the third condition is set in the range from 300 to 2000 [Pa] and the electrode distance is set in the range from 5 to 20 [mm].

17. A plasma processing method according to claim 14, wherein the electric power of the high frequency electric power supply in the plasma dicing step is 500 to 3000 [W].

18. A plasma processing method according to claim 15, wherein the electric power of the high frequency electric power supply in the mask removing step is 100 to 1000 [W].

19. A plasma processing method according to claim 16, wherein the electric power of the high frequency electric power supply in the micro-crack removing step is 50 to 3000 [W].

* * * * *